(12) United States Patent
GadelRab et al.

(10) Patent No.: US 8,051,345 B2
(45) Date of Patent: Nov. 1, 2011

(54) METHOD AND APPARATUS FOR SECURING DIGITAL INFORMATION ON AN INTEGRATED CIRCUIT DURING TEST OPERATING MODES

(75) Inventors: Serag M. GadelRab, Markham (CA); Bin Du, Markham (CA); Zeeshan S. Syed, Markham (CA); Denis Foley, Shrewsbury, MA (US)

(73) Assignee: ATI Technologies ULC, Markham, Ontario (CA)

( * ) Notice: Subject to any disclaimer, the term of this patent is extended or adjusted under 35 U.S.C. 154(b) by 573 days.

(21) Appl. No.: 12/133,173

(22) Filed: Jun. 4, 2008

(65) Prior Publication Data

US 2009/0307411 A1    Dec. 10, 2009

(51) Int. Cl.
*G01R 31/28* (2006.01)
(52) U.S. Cl. ........................................ 714/724; 714/726
(58) Field of Classification Search .................. 714/718, 714/724, 726
See application file for complete search history.

(56) References Cited

U.S. PATENT DOCUMENTS

| | | | |
|---|---|---|---|
| 5,357,572 A * | 10/1994 | Bianco et al. ................. | 713/193 |
| 5,826,007 A | 10/1998 | Sakaki et al. | |
| 6,578,180 B2 | 6/2003 | Tanner | |
| 7,062,659 B2 | 6/2006 | Bae | |
| 7,490,231 B2 * | 2/2009 | Turner et al. ...................... | 713/1 |
| 2003/0204801 A1 * | 10/2003 | Tkacik et al. ................. | 714/726 |
| 2008/0010570 A1 | 1/2008 | Yamazaki | |
| 2009/0307502 A1 | 12/2009 | GadelRab et al. | |

OTHER PUBLICATIONS

PCT International Searching Authority, International Search Report for PCT Application No. PCT/US2009/046094, Sep. 10, 2009.
Hely, D.; Bancel, F.; Flottes, M.; Rouzeyre, B.: "Test Control for Secure Scan Designs", Test Symposium, 2005, European Tallinn, Estonia, May 22-25, 2005, Piscataway, NJ, USA, IEEE, May 22, 2005, pp. 190-195, XP010801332, ISBN: 978-0-7695-2341-5, Chapter 3.

* cited by examiner

*Primary Examiner* — Jeffrey A Gaffin
*Assistant Examiner* — Daniel F McMahon
(74) *Attorney, Agent, or Firm* — Vedder Price P.C.

(57) ABSTRACT

The embodiments protect an IC against Design-For-Test (DFT) or other test mode attack. Transitory secrets are secured whether stored in registers or latches, RAM, and/or permanent secrets stored in ROM and/or PROM. One embodiment for securing information on an IC includes entering a test mode and resetting each register in response to entering the test mode of operation and prior to receiving a test mode command. An integrated circuit embodiment includes a test control logic operative to configure the integrated circuit into a test mode and to control the integrated circuit while in the test mode, a set of registers, and a functional reset controller coupled to the test control logic and to the set of registers, operative to receive a reset command from the test control logic and provide the reset command to the set of registers in response to a command to enter the test mode.

11 Claims, 13 Drawing Sheets

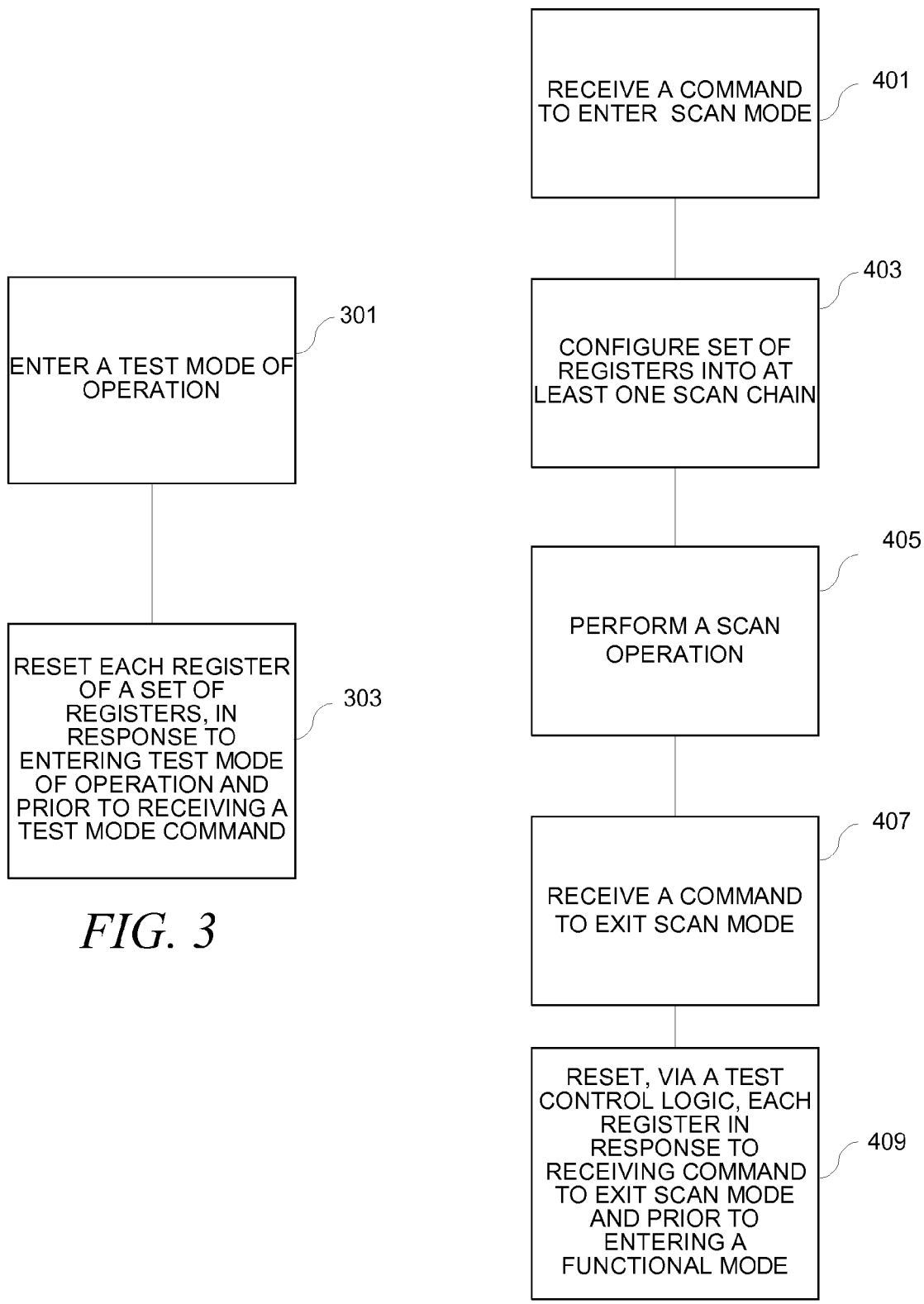

METHOD AND APPARATUS FOR SECURING DIGITAL INFORMATION ON AN INTEGRATED CIRCUIT DURING TEST OPERATING MODES

CROSS-REFERENCE TO RELATED APPLICATIONS

The present application is related to co-pending application Ser. No. 12/133,185, filed on Jun. 4, 2008, entitled Method and Apparatus For Securing Digital Information On An Integrated Circuit Read Only Memory During Test Operating Modes, which is commonly assigned to ATI Technologies ULC, along with the present application.

FIELD OF THE DISCLOSURE

The present disclosure is generally related to the field of integrated circuits (ICs) and various operating modes of ICs such as test modes including Design for Test (DFT) mode, and further related to encryption keys, passwords and other information contained within the IC, and more particularly to methods and apparatuses for securing said encryption keys, passwords and other information from access by operating the IC in a DFT or similar test mode.

BACKGROUND

The protection of digital content and other information which may be required for operation of an electronic device, is often facilitated by encryption keys and passwords stored in various locations on an integrated circuit (IC). Access to the keys by someone other than the authorized user, or even access by the authorized user himself, could result in theft or misappropriation of copyrighted or otherwise protected digital material. Additionally, protected digital content or other secret information is often times decoded or unencrypted using the fore mentioned encryption keys, and stored temporarily by the IC within memory or register locations. Access to the memory or registers could also lead to the theft or misappropriation of content by unauthorized users.

New approaches to illicitly obtain protected digital content are coming into vogue wherein an unauthorized party may attempt to access protected digital materials at the IC level, by attempting access to IC internal registers and memory. These attacks utilize the IC design itself and attempt to take advantage of incorporated IC test features such as an operating mode know as "Design-for-Test" (DFT) mode. Design-for-Test attacks have thus created new concerns within the information security field and threaten the information security of various IC portions such as, but not limited to, static random access memory (SRAM), read only memory (ROM), programmable read only memory (PROM), registers and flip-flops.

Recently proposed methods have attempted to address the protection of registers and latches from a DFT Attack. One such recently proposed method for protecting registers is to enumerate "secret-bearing" registers and exclude them from the DFT process. However this method has several disadvantages. First, by excluding registers it reduces the test coverage for DFT thus reducing the overall IC yield. Second, it is error-prone because it requires the designer to identify and manually remove the "secret-bearing" registers from the DFT process and the specific secret-bearing registers may be difficult or even impossible to accurately identify. Third, the method assumes that secret information is only contained in the registers but not in memory.

Another proposed method is based on obfuscation where the contents of different registers are multiplexed together in a pseudo-random fashion. This approach also has a disadvantage in that it requires a specialized DFT algorithm which is not supported by industry-standard Computer Aided Design (CAD) tools. A second disadvantage of this method is its reliance on obfuscation which may be subject to reverse-engineering by a determined hacker.

Therefore a need exists for methods and apparatuses to secure protected information from access by unauthorized users employing IC operating mode attacks such as Design-for-Test attacks or similar attacks taking advantage of an IC test mode.

BRIEF DESCRIPTION OF THE DRAWINGS

FIG. 3 is a flow chart of a method of operation of an embodiment for protecting register data.

FIG. 4 is a flow chart providing further details of a method for protecting register data in accordance with an embodiment.

DETAILED DESCRIPTION

Figure 1:
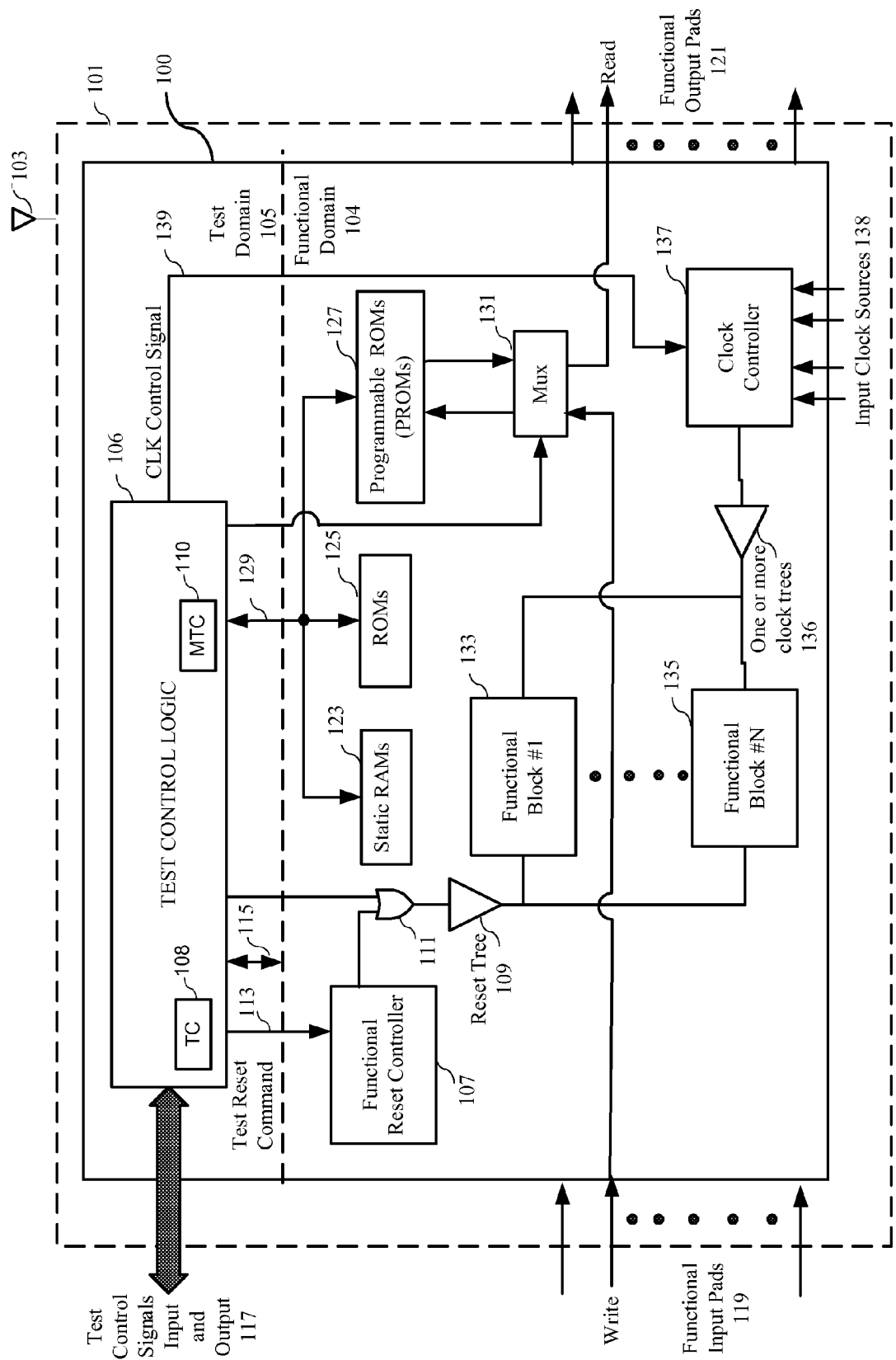
FIG. 1 is a block diagram of an integrated circuit in accordance with an embodiment.

The various embodiments herein disclosed provide for protection of secret information on an IC from access by using test modes of operation of the IC. For example, the various embodiments herein described protect the IC again a Design-For-Test (DFT) attack. The embodiments secure transitory secrets stored in registers or latches, transitory secrets stored in RAM, permanent secrets stored in Read-Only-Memories (ROM), and/or permanent secrets stored in Programmable ROMs (PROM) such as on-chip fuses.

A method of securing information on an integrated circuit disclosed herein includes entering a test mode of operation and resetting each register of a set of registers, in response to entering the test mode of operation and prior to receiving a test mode command. The method may further include receiving a command to enter scan mode, configuring the set of registers into at least one scan chain, performing a scan operation, receiving a command to exit said scan mode, and resetting, via a test control logic, each register of the set of registers, in response to receiving the command to exit said scan mode and prior to entering a functional mode. The method of resetting may be via a reset command provided by a functional reset controller within the device. The method may further include resetting flip flops, and may also include writing a known bit pattern to all locations of a Random Access Memory (RAM) in response to entering the test mode of operation, and after initially blocking RAM read commands, and allowing subsequent RAM read commands after writing the known bit pattern.

Another method of securing information on an integrated circuit includes entering a test mode of operation, determining that the integrated circuit was operated in a functional mode of operation prior to entering the test mode of operation in response to entering the test mode of operation, and blocking Random Access Memory (RAM) read commands when in the test mode of operation in response to determining that the integrated circuit was operated in the functional mode of operation prior to entering the test mode of operation. The method may also include that determining that the integrated circuit was operated in the functional mode of operation prior to entering the test mode of operation, further includes determining that a set of registers contains encrypted data in response to entering the test mode of operation, the set of registers being separate from a scan chain configuration.

Another method of securing information on an integrated circuit includes entering a test mode of operation, receiving a Read Only Memory (ROM) read command, writing data from a plurality of ROM address locations to an encryption logic in response to receiving the ROM read command, and writing an encryption logic output of the encryption logic to a test control logic, the encryption logic output representing the data from the plurality of ROM address locations. The method may further include that writing the data from the plurality of ROM address locations to the encryption logic, further includes writing the data from the plurality of ROM address locations to a multiple input shift register (MISR) in response to the ROM read command, and writing an MISR output to the test control logic, the MISR output representing the data from the plurality of ROM address locations.

Another method of securing information on an integrated circuit includes entering a test mode of operation, receiving a Programmable Read Only Memory (PROM) read command subsequent to entering the test mode of operation, the PROM read command specifying a read address, determining that the read address points to secret information, and providing a benign output pattern in response to the PROM read command. The method may further include that determining that the read address points to secret information further includes reading at least one PROM address location, where the PROM address location identifies where secret information is stored within the PROM, and storing the PROM address location in a PROM protection register.

Another method of securing information on an integrated circuit includes entering a test mode of operation, resetting each register of a set of registers, in response to entering the test mode of operation and prior to receiving a test mode command, determining that the integrated circuit was operated in a functional mode of operation prior to entering the test mode of operation in response to entering the test mode of operation, blocking Random Access Memory (RAM) read commands when in the test mode of operation in response to determining that the integrated circuit was operated in the functional mode of operation prior to entering the test mode of operation, receiving a Read Only Memory (ROM) read command, writing data from a plurality of ROM address locations to an encryption logic in response to receiving the ROM read command, writing an encryption logic output of the encryption logic to a test control logic, the encryption logic output representing the data from the plurality of ROM address locations, receiving a Programmable Read Only Memory (PROM) read command subsequent to entering the test mode of operation, the PROM read command specifying a read address, determining that the read address points to secret information, and providing a benign output pattern in response to the PROM read command.

An integrated circuit is disclosed herein that includes a test control logic operative to configure the integrated circuit into a test mode and to control the integrated circuit while in the test mode, a set of registers, and a functional reset controller coupled to the test control logic and to the set of registers, operative to receive a reset command from the test control logic and provide the reset command to the set of registers in response to a command to enter the test mode. The integrated circuit test control logic may be further operative to receive a command to enter a scan mode, configure the set of registers into at least one scan chain in response to the command to enter the scan mode, perform a scan operation on the at least one scan chain, receive a command to exit the scan mode, and reset each register of the set of registers, in response to receiving the command to exit the scan mode and prior to entering a functional mode.

Another integrated circuit disclosed herein includes at least one Random Access Memory (RAM), a test control logic coupled to the at least one RAM, the test control logic being operative to configure the integrated circuit into a test mode and to control the integrated circuit while in the test mode, determine that the integrated circuit was operated in a functional mode prior to entering the test mode in response to entering the test mode, and block RAM read commands when in the test mode in response to determining that the integrated circuit was operated in the functional mode prior to entering the test mode. The integrated circuit may further include a set of registers coupled to the test control logic, the set of registers being separate from a scan chain configuration of the test mode, and the test controller may be further operative to determine that the integrated circuit was operated in the functional mode prior to entering the test mode by determining that the set of registers contains encrypted data in response to entering the test mode.

Another integrated circuit disclosed herein includes at least one Read Only Memory (ROM), an encryption logic, and a test control logic coupled to the at least one ROM, and to the encryption logic, the test control logic being operative to configure the integrated circuit into a test mode, receive a ROM read command, write data from a plurality of ROM address locations to the encryption logic in response to receiving the ROM read command, and write an encryption logic output of the encryption logic to the test control logic, the encryption logic output representing the data from the plurality of ROM address locations. The integrated circuit encryption logic may further include at least one multiple input shift register (MISR), coupled to the test control logic, and the test control logic may be further operative to write the data from the plurality of ROM address locations to the at least one MISR in response to the ROM read command, and write an MISR output to the test control logic, the MISR output representing the data from the plurality of ROM address locations.

Another integrated circuit disclose herein includes at least one Programmable Read Only Memory (PROM), a test control logic coupled to the at least one PROM, the test control logic being operative to configure the integrated circuit into a test mode and to control the integrated circuit while in the test mode, receive a (PROM) read command subsequent to entering the test mode, the PROM read command specifying a read address, determine that the read address points to secret information, and provide a benign output pattern in response to the PROM read command. The integrated circuit may further include a PROM access logic coupled to the at least one PROM, a PROM protection register coupled to the at least one PROM and to the PROM access logic, a PROM protection register controller coupled to the PROM protection register, to the at least one PROM, and to the test control logic; and the test control logic may be further operative to determine that the read address points to secret information by sending a control signal to the PROM access logic, the PROM access logic being operative to read at least one PROM address location, the PROM address location identifying where secret information is stored within the PROM, and store the PROM address location in the PROM protection register.

Another integrated circuit disclosed herein includes a test control logic operative to configure the integrated circuit into a test mode and to control the integrated circuit while in the test mode, a set of registers, a functional reset controller coupled to the test control logic and to the set of registers, operative to receive a reset command from the test control logic and provide the reset command to the set of registers in response to a command to enter the test mode, at least one Random Access Memory (RAM) coupled to the test control logic, at least one Read Only Memory (ROM) coupled to the test control logic, an encryption logic coupled to the test control logic, and at least one Programmable Read Only Memory (PROM) coupled to the test control logic, wherein the test control logic is further operative to determine that the integrated circuit was operated in a functional mode prior to entering the test mode in response to entering the test mode, block RAM read commands when in the test mode in response to determining that the integrated circuit was operated in the functional mode prior to entering the test mode, receive a ROM read command, write data from a plurality of ROM address locations to the encryption logic in response to receiving the ROM read command, receive an encryption logic output of the encryption logic, the encryption logic output representing the data from the plurality of ROM address locations, receive a (PROM) read command subsequent to entering the test mode, the PROM read command specifying a read address, determine that the read address points to secret information, and provide a benign output pattern in response to the PROM read command.

Turning now to the drawings wherein like numerals represent like components, FIG. 1 is a block diagram of an exemplary Integrated Circuit (IC) 100 in accordance with the embodiments. The IC 100 may be incorporated into an electronic device 101, which may be any suitable electronic device such as, but not limited to, a wireless communication device communicating via an antenna 103, a PDA, laptop computer, desktop computer, etc. The IC 100 internal circuitry may be categorized into two logical domains: a Functional Domain 104 and a Test Domain 105. The Functional Domain 104 includes all circuitry and/or components required for normal operation of the IC 100, for example, functional block 133 through functional block 135, and various memories. The functional blocks 133 through 135 may include various registers, flip flops, latches and/or logic gates as required for operation of the IC 100. The various memories may include Random Access Memories (RAMs) such as Static RAM memories 123, Read Only Memories (ROMs) 125, and Programmable ROMs (PROMs) 127.

A Functional Reset Controller 107 is coupled to the various functional blocks 133 through 135, and is operative to provide a reset signal to all functional blocks within the Functional Domain 104 through a logical structure known as a Reset Tree 109. For example, the reset signal may be used to erase the content of each register of the functional blocks 133 through 135 and to force the state of each register to a known value which may be determined by the IC 100 designer. The reset signal is applied to the Reset Tree 109 by the Functional Reset Controller 107 for a duration long enough to reset all registers prior to commencement of operation.

The Functional Blocks 133 through 135, and any corresponding included registers, flip flops, latches, etc., are coupled to corresponding clocks (not shown) for providing timing signals to the Functional Blocks. The clocks may further be connected to various clock trees 136 which are further coupled to a Clock Controller 137. The Clock Controller 137 is present within the Functional Domain 104, and is operative to generate and/or route the various clock signals to all synchronous components of the IC 100 to ensure proper operation and to synchronize all the clocks connected to the clock trees 136 by providing a synchronization signal. The Clock Controller 137 and clock trees 136 may also operate in the Test Domain 105 in some embodiments.

The IC 100 includes write functional input pads 119 and read functional output pads 121, for receiving data and outputting data, respectively. The write functional input pads 119 and read functional output pads 121 may be coupled to additional internal circuitry (not shown) of the electronic device 101, where the internal circuitry may provide inputs and outputs at, for example, a physical connection port of the electronic device 101, such that the IC 101 may read and write data to and from an external connection. In some embodiments the IC 101 may be directly connected to physical input/output connections of the electronic device 101 via the write functional input pads 119 and read functional output pads 121.

In the IC 100 Test Domain 105, which may in some embodiments correspond to a Design-for-Test (DFT) operating mode, various other components are active that may not be active or in operation during normal IC 100 operation. For example, the Test Domain 105 includes a Test Control Logic 106 which is operative to configure the IC 100 into a test mode and to control the IC 100 while in the test mode. The Test Control Logic 106 controls the Test Domain 105 via one or more control lines 115 over which the Test Control Logic 106 may send commands and receive responses from various components of the Functional Domain 104, such as, but not limited to, Functional Blocks 133 through 135 which include various registers, flip flops, latches, logic gates, etc. The Test Control Logic 106 is also coupled to the Clock Controller 137 via a Clock Control Signal Line 139 and is operative to send commands, that activate and stop the various clocks, to the Clock Controller 137 to cause the Clock Controller 137 to, in response, provide, or withhold, a synchronization clock signal, or signals, to all clocks connected to the clock tree 136.

The Test Control Logic 106 is coupled to a test control signal input and output port 117, which may correspond to one or more pins of the IC 100. The test control signal input and output port 117 may be a DFT input and output port. The test control signal input and output port 117 may further be coupled to a corresponding connector on the electronic device 101 to provide access to testing functionality. However, in some embodiments the IC 100 itself, or a circuit board internal to the electronic device 101 which incorporates the IC 100, must be accessed directly to interface with the test control signal input and output port 117. Therefore, in any of the embodiments, there is a potential threat that a malicious user, or hacker, may attempt access to the Test Control Logic 106 by accessing the test control signal input and output port 117. In other words, in some cases a hacker may need to partially disassemble an electronic device 101 in order to gain access to the IC 100 test functions. Any type of access to the Test Control Logic 106 that may be obtained by a hacker, whether by, for example, disassembly of a device or access through a physical connection, is hindered by the various embodiments herein disclosed.

The Test Control Logic 106 may include one on more Test Controllers (TC), for example TC 108, and may further include one or more Memory Test Controllers (MTC), for example MTC 110. In some embodiments, the one or more MTCs, such as MTC 110, may be located within the Functional Domain 104. The Test Control Logic has various control lines 129 for sending commands to, and receiving data from, the various memories including RAM 123, ROM 125 and PROM 127. In some embodiments, the MTC 110 will communicate with one or more of the memories using the control lines 129, and may send various test commands to the memories and receive test output from the memories.

It is to be understood that FIG. 1 and all other FIGs. provided with the present disclosure are exemplary only, and are for the purpose of describing and explaining to one of ordinary skill how to make and use the various embodiments disclosed herein. Therefore, FIG. 1 and all other FIGs. herein provided are limited to showing elements, components, etc. as necessary to facilitate an understanding by one of ordinary skill of how to make and use the various embodiments and are not intended to be complete schematic representations of, for example, any IC or any electronic device incorporating the herein disclosed embodiments. Therefore, one skilled in the art will understand that an IC and/or an electronic device may include various other elements, components, etc. as necessary for operation of the IC and/or electronic device. Further one skilled in the art will understand that with respect to FIG. 1, the Test Domain 105 and the Functional Domain 104 may likewise include other blocks elements, components, etc., not shown in FIG. 1 and/or the other FIGs. of the present disclosure and that any such blocks that may be required for the proper operation of the IC would be understood by one of ordinary skill to be present as necessary.

During normal operation of the IC 100, the Test Control Logic 106, and any TCs and MTCs such as TC 108 and MTC 110, are inactive and do not interfere with the IC 100 Functional Domain 104 operations. However when a user activates a test mode of the IC 100 and therefore activates the Test Domain 105, the test functions of the IC 100 are activated including for example, Test Control Logic 106, TC 108, MTC 110 and any other TCs and MTCs. The test operating mode may be for example, a Design-for-Test (DFT) operating mode of the IC 100. When such test functions of the IC 100 are active, the IC 100 is said to be in "Test Mode."

Thus when IC 100 is in a Test Mode, the Test Domain 105 is active. The Test Control Logic 106 of the embodiments is coupled to the Functional Reset Controller 107 via a Test Reset Command line 113. The Functional Reset Controller 107 is operative to receive a Test Reset Command, via Test Reset Command line 113, and provide a reset command to the registers and flip flops of the Functional Blocks 133 through 135 as will be described further.

While the IC 100 is operating in the Test Mode, a user can command the Test Control Logic 106, via the test control signal input and output port 117, to perform a variety of tests on the IC 100 internal circuitry. For example, one of the key DFT tests is known as the "Scan Test" (ST). To administer a Scan Test the Test Control Logic 106 will reconfigure all registers and other logic within the IC 100 into one or more "Scan Chains." Under this configuration, the IC 100 is said to be in "Scan Mode."

Figure 2:
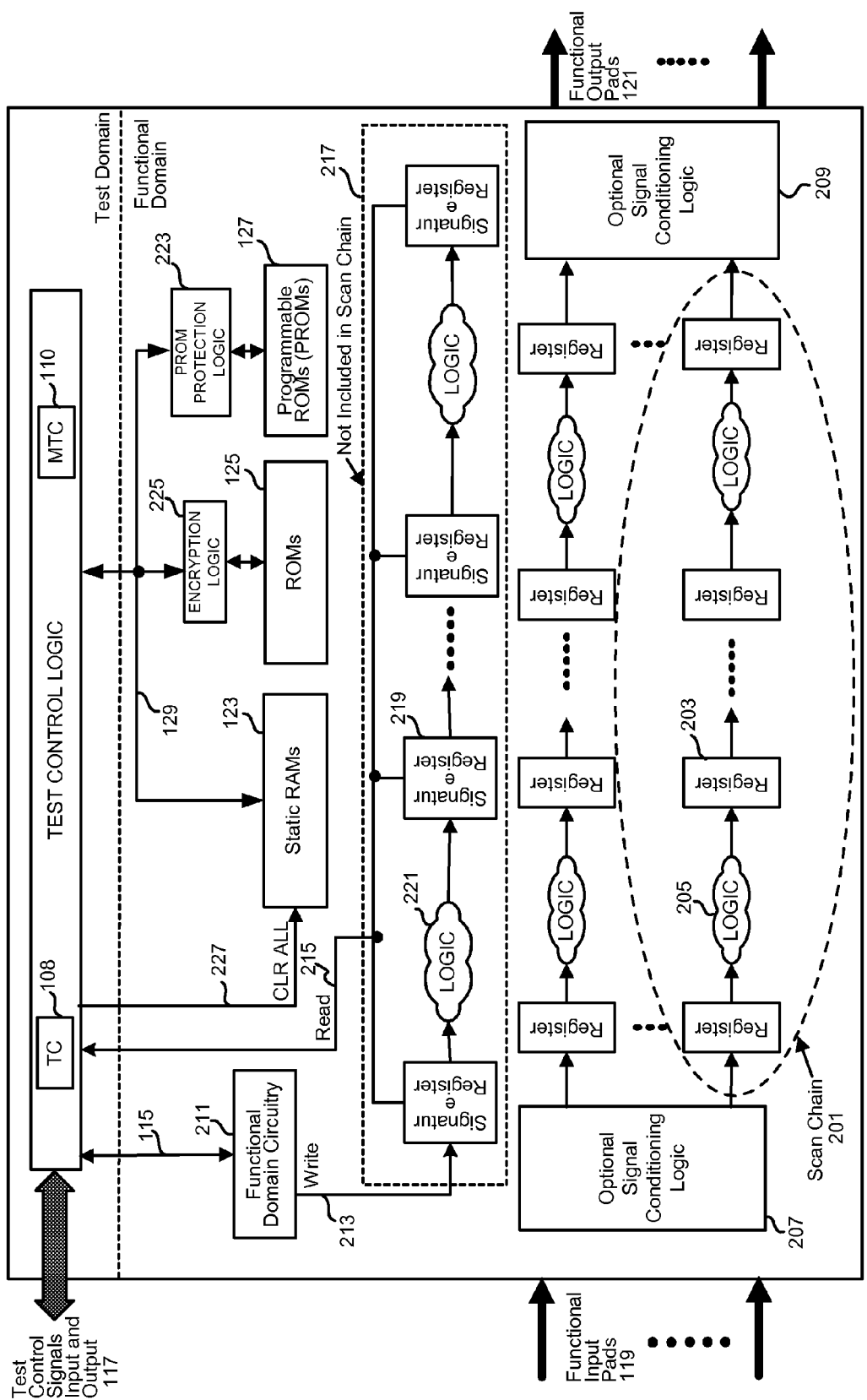
FIG. 2 is a block diagram of an integrated circuit in test mode and having scan chains in accordance with an embodiment.

FIG. 2 illustrates the IC 100 when configured in Scan Mode and having one or more Scan Chains such as Scan Chain 201. The Scan Chains, such as Scan Chain 201, consist of various registers 203 and/or other corresponding logic 205. The logic 205 may include, for example flip flops or other logic elements. In some embodiments, the MTCs such as MTC 110, may also be forced to be part of the Scan Chain configuration.

During Scan Mode, test data is propagated into the IC 100 by shifting in new data through the Functional Input pads 119, and reading out register data through the Functional Output pads 121. Therefore, a possible attack vector contemplated by the present disclosure that could compromise secrets stored within the IC 100 registers 203 may include: 1) Resetting the IC 100 and operating in Functional Mode until secrets exist within the IC 100 registers 203, or other logic such as flip flops, latches, etc.; 2) Switching the IC 100 to Test Mode and then to Scan Mode; 3) Reading the outgoing stream of bits and Functional Output pads 121 which contains the contents of the IC 100 registers 203 prior to going into Test Mode; and 4) Extracting register 203 resident secrets from the outgoing bit stream.

A second possible attack vector contemplated by the present disclosure that would compromise secrets stored within the IC 100 registers 203 may include: 1) Resetting the chip and operating in Functional Mode until secrets exist within the IC 100 registers 203; 2) Switching the IC 100 to Test Mode and then to Scan Mode; 3) Injecting a register configuration through the Functional Input Pads 119 such that the final contents of the registers 203 disables the security features of the Functional Mode; 4) Returning the IC 100 into Functional Mode; and 5) Utilizing the reduced security state of the IC 100 to access secrets within the IC 100 registers 203 and memories (RAM 123, ROM 125, and PROM 127).

The various embodiments defeat these two contemplated attack vectors by resetting all registers prior to entering into Scan Mode and, in some embodiments, also after exiting Scan Mode, but prior to entering functional mode. The Test Control Logic 106 of the embodiments is in charge of the IC 100 entry and exit into Scan Mode. In the event the IC 100 is placed into Test Mode, the Test Control Logic 106 will wait for external command, for example from the test control signal input and output port 117, to enter Scan Mode and configure the IC 100 into Scan Chains such as Scan Chain 201.

At this point, prior to configuring the IC 100 Scan Chains, the Test Control Logic 106 will send a command to the Clock Controller 137 to activate all clock synchronization signals, and then send a test reset command via Test Reset Command line 113 to the Functional Reset Controller 107. The Functional Reset Controller 107 will in response send a reset command over the reset tree 109 and reset all registers 203 in the IC 100. This reset may also include resetting all latches, flip flops and any other logic element that may store state data.

After resetting, the Test Control Logic 106 proceeds to place the IC 100 into Scan Mode as shown in FIG. 2, thereby configuring the IC 100 into one or more Scan Chains such as Scan Chain 201. The Test Control Logic 106 then waits for another external command, for example, a command to return IC 100 into Functional Mode. The Test Control Logic 106 may in some embodiments perform another reset of all registers 203 and other logic 205 in IC 100 it prevent access to any secret data. The Test Control Logic 106 may then return the IC 100 into Functional Mode as shown in FIG. 1.

FIG. 3 illustrates the method of operation as described above. In 301 the IC enters a Test Mode of operation and in 303, and in response, resets each register of a set of registers, for example all registers in the Scan Chains. As shown in 303, the reset is performed before the IC receives any Test Mode command. In accordance with an embodiment, the Test Control Logic 106 provides the reset via a Test Reset Command line 113.

The resetting of all registers as shown in FIG. 3 may be accomplished in various ways. For example, a new Reset Tree, additional to the Reset Tree 109, may be included in the IC 100. For this embodiment, the additional Reset Tree would be driven by the Test Control Logic 106. This embodiment however requires that a second reset tree be inserted in the IC, and reset trees consume a large amount of IC area and power.

Therefore in another embodiment, the Test Control Logic 106 may use the existing Reset Tree 109, which emanates from the Functional Reset Controller 107, to perform a reset of all IC registers. In this embodiment, a test reset command signal is issued from the Test Control Logic 106 to the Functional Reset Controller 107 via the Test Reset Command line 113. When the Test Control Logic 106 asserts the test reset command, the Functional Reset Controller 107 issues a reset over the Reset Tree 109 to all registers within the IC thus clearing their content. Therefore this embodiment eliminates the need for a second reset tree, thus reducing the overall IC area and complexity.

FIG. 4 illustrates further details of a method in accordance with the embodiment shown in FIG. 3 wherein the Functional Reset Controller 107 is used to issue the reset command. Subsequent to the reset in 303, the Test Control Logic 106 may, in 401, receive a command to enter scan mode, for example via test control signal input and output port 117. The Test Control Logic 106 may then, in 403, proceed to configure registers into one or more Scan Chains, such as Scan Chain 201. The Test Control Logic 106 may proceed to allow a scan operation to be performed as shown in 405. If the Test Control Logic 106 receives a command to exit scan mode as shown in 407, the Test Control Logic 106 may again send a test reset command to the Functional Reset Controller 107 to cause the reset of all registers on the Reset Tree 109. This thus provides an additional measure of security in the event that any registers contain secret information as a result of some test operation or otherwise.

Figure 5:
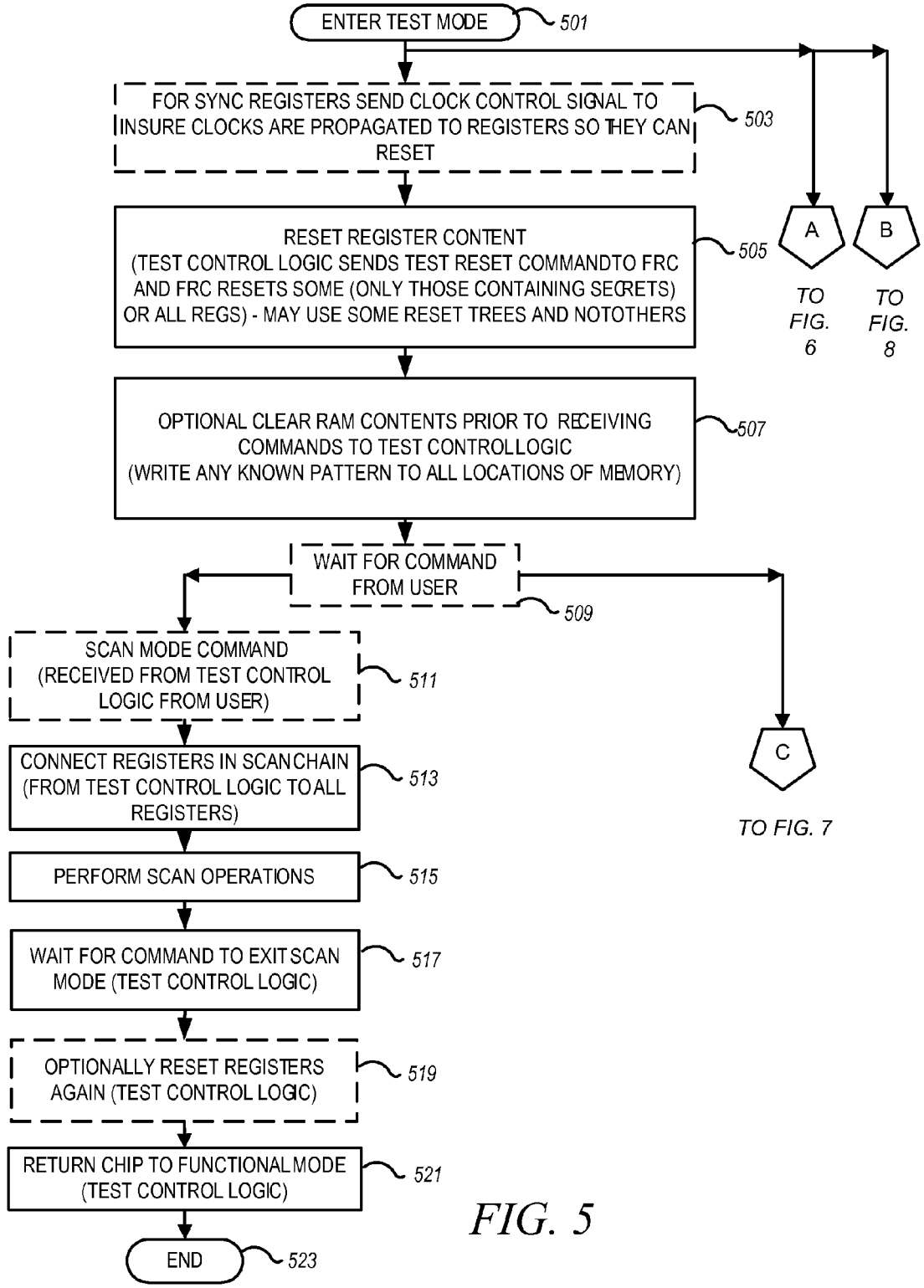
FIG. 5 is a flow chart showing details of operation of embodiments protecting data throughout various locations of an IC, and specifically for registers and RAM on FIG. 5.

FIG. 5 illustrates further details of operation in accordance with some embodiments. When the IC 100 enters a test mode as shown in 501, the Test Control Logic 106 may send a clock control signal over Clock Control Signal Line 139 to the Clock Controller 137. The Clock Controller 137 will in response activate all clock synchronization signals to all register clocks using the clock trees 136. After clock synchronization, the Test Control Logic 106 may provide the reset to the Functional Reset Controller 107 as shown in 505. The reset provided by the Function Reset Controller 107 may also provide a reset to the RAM 123, as shown in 507, to cause RAM contents to be cleared. This may be accomplished by, for example, writing a known bit pattern to all memory locations of the RAM 123. If the Test Control Logic 106, or a MTC such as MTC 110 can autonomously overwrite all RAM 123 memory locations, the Test Control Logic 106, or the TC 108 in some embodiments, waits for the MTC 110 to complete the RAM overwrite task. However if the MTC 110 can only write one RAM 123 memory location at a time, then the TC 108 of the Test Control Logic 106 will issue a stream of write commands to force the MTC 110 to overwrite each RAM 123 memory location.

The Test Control Logic 106 may then wait for external command to enter Scan Mode as shown in 509. If the Scan Mode command is received as in 511, the Test Control Logic 106 will place the IC 100 in Scan Mode, and in 513 will connect the registers into one or more scan chains as shown in FIG. 2. In 515, the Test Control Logic 106 may perform a scan operation. The scan operation may be in response to another command or may be done in the normal course of test mode configuration in some embodiments. In 517, the Test Control Logic 106 will wait for a command to exit scan mode and in 519, will once again reset the registers in some embodiments and as was described previously. The Test Control Logic 106 may then return the IC 100 to functional mode and thus to the Functional Domain 104 as shown in FIG. 1. The register protection method of the embodiments ends as shown in 523.

Also, some embodiments may reset the registers asynchronously, that is, without any clock requirement. Alternatively, the registers may be reset synchronously where the Clock Controller 137 receives a clock control signal from the Test Control Logic 106 as was described.

The method illustrated by FIG. 5 may act in tandem with additional methods for securing digital information on the IC 100 during test mode, and these methods are shown on FIGS. 6, 7, 8 and 9. These additional methods for securing digital information on other portions of the IC 100 will now be described.

In Test Mode an external user may initiate a test of the IC 100 RAM 123 by sending appropriate commands to the Test Control Logic 106, or more specifically in some embodiments, sending commands to one or more Memory Test Controllers such as MTC 110, via one or more Test Controllers such as TC 108. Some MTC commands may, for example, cause the contents of RAM 123 to be read out by the user over the read functional output pads 121. A malicious user could therefore read secrets stored in RAM 123 using for example, the following RAM test attack algorithm: 1) reset the IC 100 and operate in Functional Mode until secrets exist within the IC 100 RAM 123, 2) switch the IC 100 to Test Mode, 3) issue commands to one or more MTCs, such as MTC 110, to read out the contents of RAM 123, 4) extract RAM 123 resident secrets from the contents of the RAM 123.

To defeat such RAM-based attacks, the embodiments clear all contents of all RAM in the IC, for example RAM 123 in IC 100, prior to allowing an external user to access any contents of the RAM. Various embodiments will now be described for protection of the RAM.

A first embodiment was shown in FIG. 5 block 507, where the Test Control Logic 106 may clear all memories upon entry into Test Mode. However, clearing the entire RAM consumes time and therefore may increase the test costs of the IC 100. A second embodiment, shown in FIG. 7, therefore does not require complete clearing of the RAM but rather only clears the RAM when the Test Control Logic 106 receives the first command that relates to reading an internal RAM such as RAM 123.

Figure 7:
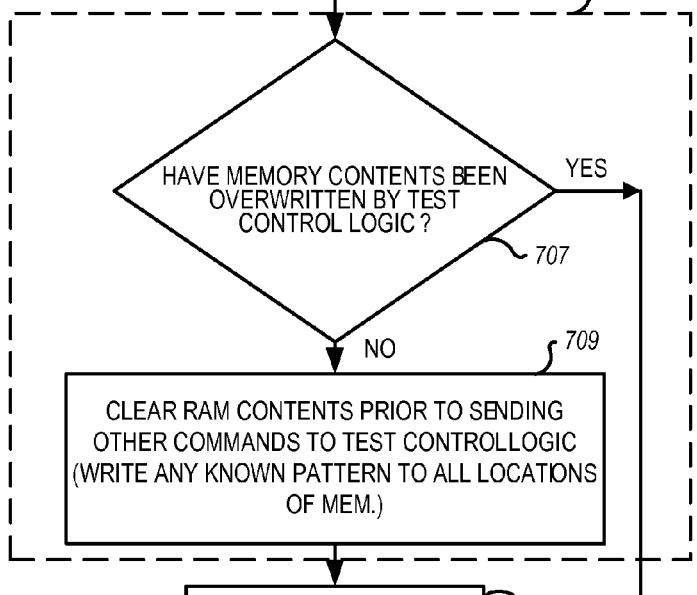
FIG. 7 is a flow chart showing details of operation of embodiments protecting data throughout various locations of an IC in continuation of FIG. 5, and for protecting RAM.

Thus in 703 of FIG. 7 a command from an external user may be received for accessing RAM or to access RAM via an MTC such as MTC 110. Prior the receiving the RAM access command, the Test Control Logic 106 or a TC 108 may have processed all non-RAM related test commands normally.

However, upon receipt of the first RAM-related command from the external user, the Test Control Logic 106 issues internal commands to each MTC, such as MTC 110, to overwrite all RAM 123 locations with a known pattern. If the Test Control Logic 106, or MTC 110 can autonomously overwrite all RAM 123 locations, then the Test Control Logic 106 waits for the MTC 110 to complete its task. Thus in 707 if the RAM 123 memory locations have been overwritten then any subsequent commands may be processed normally as shown in 711. However if in 707 the MTC 110 can only write one RAM 123 memory location at a time, then the Test Control Logic 106 in 709 will issue a stream of write commands to force the MTC 110 to overwrite each RAM 123 memory location. The Test Control Logic 106 may then proceed in 711 with processing of first RAM-related test command Subsequent RAM-related test commands are processed without having to clear the RAM 123 a second time.

Figure 9:
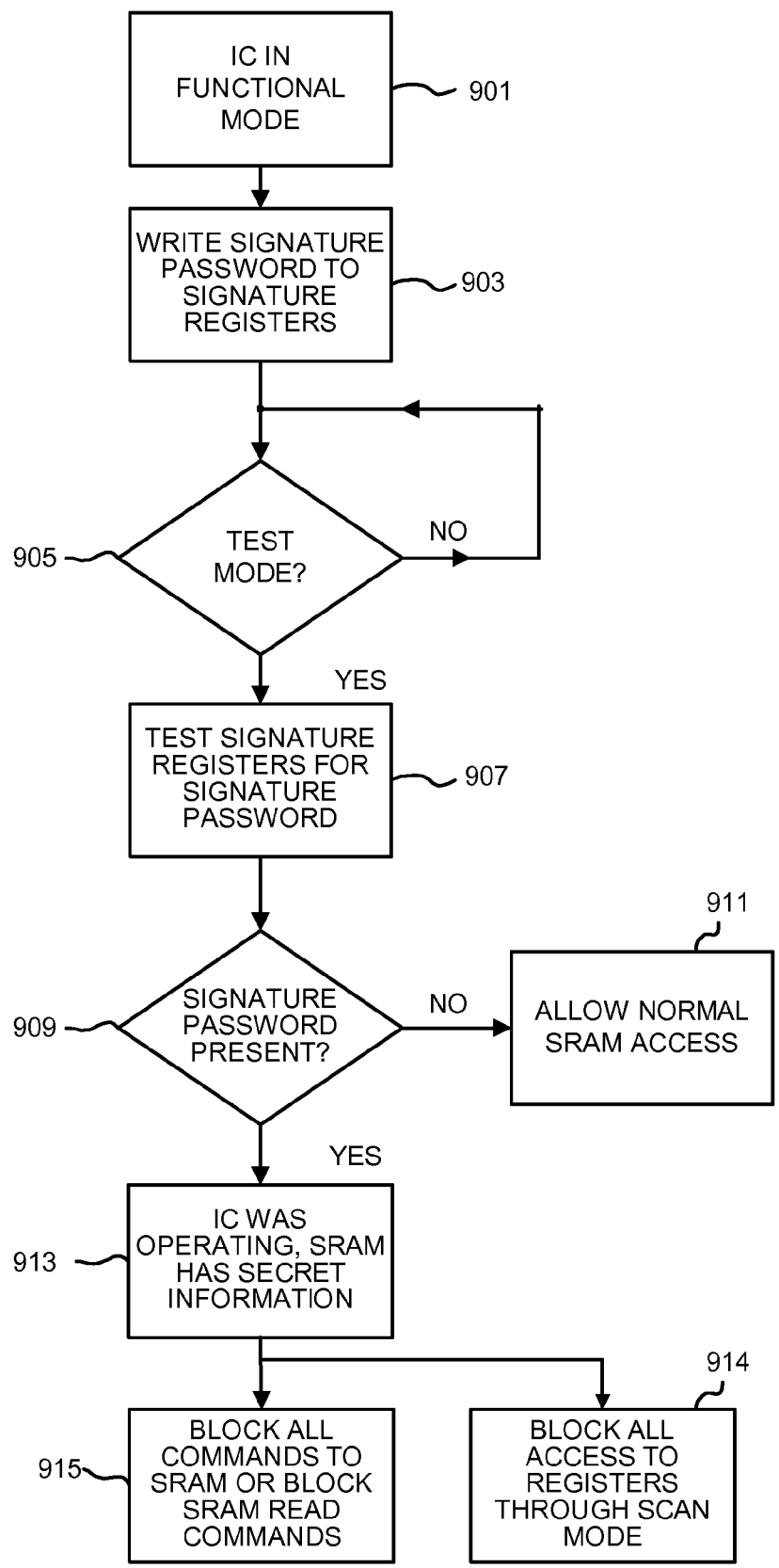
FIG. 9 is a flow chart showing details of operation for an alternative embodiment for protecting RAM.

The embodiments described herein thus far may be executed regardless of the prior state of the IC 100. However, in some embodiments, some of the methods may be omitted during the IC production tests, when the IC contains no dynamically created secrets, to reduce test time and therefore also reduce the cost of the IC. Therefore a third embodiment for protection of the RAM is illustrated in FIG. 2 and FIG. 9, wherein the RAM protection methods may be omitted during IC production testing. Also, the register protection method may be omitted from IC production testing in some embodiments.

FIG. 2 shows a group of secure and secret Signature Registers 217 that are not included in any Scan Chain and are thus not scan-able, although they may be reset-able in some embodiments. The group of secure Signature Registers 217 are inserted into the Functional Domain 104 of the IC 100. These Signature Registers 217 are writable by the Functional Domain Circuitry 211, for example, by the write input lines 213, and are readable by the Test Control Logic 106, for example, by the read lines 215.

A method of operation of an embodiment having the Signature Registers 217 is illustrated by FIG. 9. At power-up of the IC 100, the value of the Signature Registers 217 is random and unknown. When the IC 100 operates in Functional Mode as in 901, the Functional Domain circuitry 211 of the IC 100, as shown in 903, writes a predetermined Signature Password into the Signature Registers 217 prior to creating any secret information or receiving secret information from the outside world.

Whenever Test Mode is enabled in 905, the Test Control Logic 106 checks the values of the Signature Registers 217 as shown in 907. If the Signature Registers contain the predetermined Signature Password in 909, then the RAM 123 is assumed to have secret information in 913 due to the Functional Mode operation. The Test Control Logic 106 will thus in 915 refuse to accept external test commands and all test operations, for example DFT operations, will be disabled. However if the signature password is not present in 909, the Test Control Logic 106 may allow normal RAM 123 access as shown in 911.

To re-activate the Test Control Logic 106 functions with respect to RAM, the IC 100 power must be removed and then reapplied. This process of removing and restoring the power to the IC 100 will force the contents of all registers and RAMs to return to a random and unknown state. The number of Signature Registers 217 that holds the predetermined Signature Password must be high enough to ensure a very low probability for a scenario where the power-up value of the registers equals the predetermined Signature Password.

Figure 10:
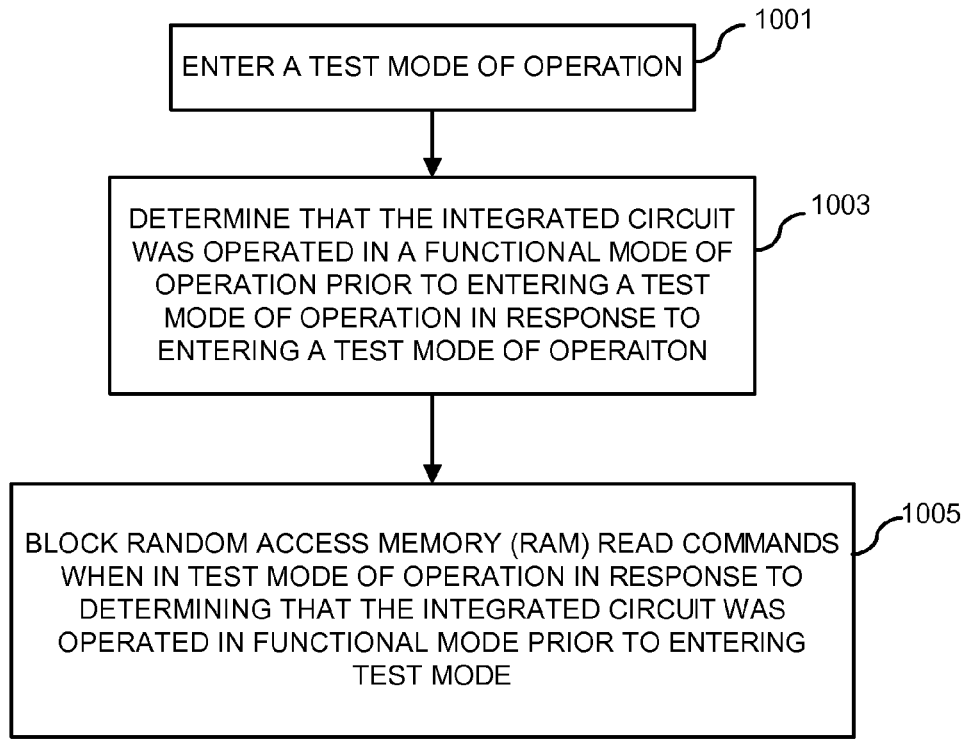
FIG. 10 is a flow chart illustrating operation of an embodiment for protecting RAM.
Figure 11:
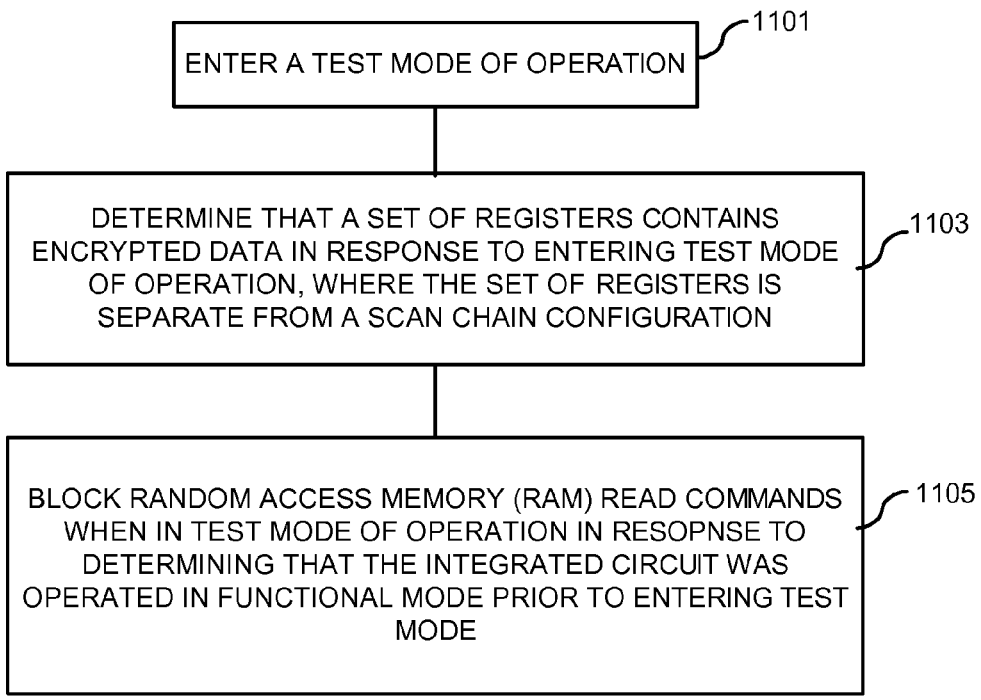
FIG. 11 is a flow chart illustrating additional details of an embodiment for protecting RAM.

Although the embodiment just described employed the Signature Registers 217, any suitable form of encrypted data may be used in accordance with the embodiments. A method in accordance with the embodiments is illustrated in FIG. 10 where the IC enters a Test Mode in 1001, and in response in 1003 determines that the IC was operated in Functional Mode prior to entering Test Mode. In 1005, access to RAM by read commands in test mode is blocked because the Test Control Logic 106 assumes that the RAM will have secret information based on the determination in 1003. In FIG. 11, after entering Test Mode in 1101, a set of registers is determined to contain encrypted data in 1103, where the set of registers is separate from any scan chain. In 1105 access to RAM by read commands in test mode is blocked because the Test Control Logic 106 assumes that the RAM will have secret information based on the determination in 1103. The determination that the registers contain encrypted data may be made in some embodiments by comparing the register contents with an a priori known encrypted data and determining that the register contents match the an a priori known encrypted data.

Embodiments for protection of PROM will now be described. On-chip Programmable Read-Only-Memories (PROM) such as Fuses, are used to store various keys and secret IC identification information. PROMs are generally accessible through the external IC pads such as write functional input pads 119 and read functional input pads 121 and via mux 131, so that they can be programmed at the manufacturing facility.

However, once this programming step is accomplished, the content of the PROMs must not be readable by a malicious user. Access to PROMs must not be compromised during test modes such as DFT modes. The direct connectivity of PROMs to external pads (functional input pads 119, 121) as shown in FIG. 1, renders the PROMs vulnerable to an attacker if the attacker is able to manipulate the input values of the functional input pads 119 during test mode such as DFT mode.

Figure 12:
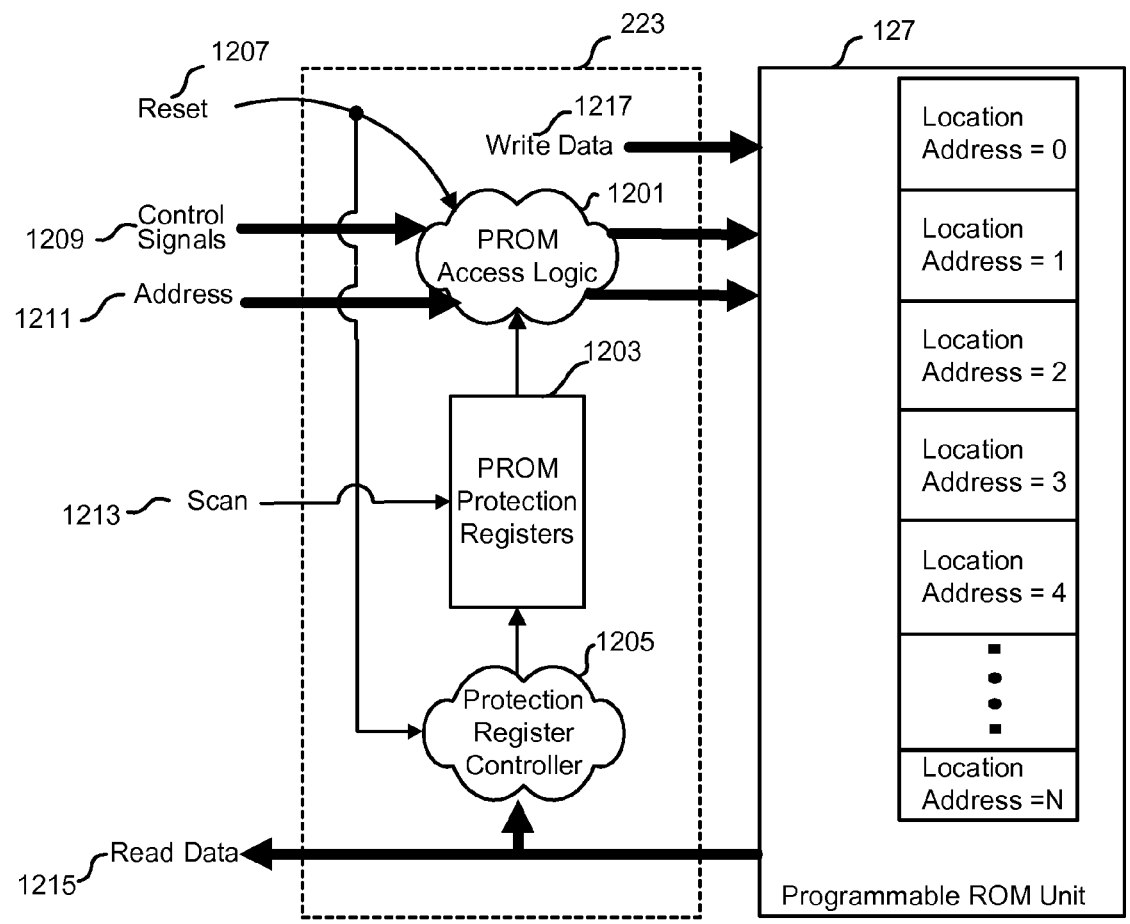
FIG. 12 is a block diagram of an integrated circuit PROM protection in accordance with an embodiment.

FIG. 12 illustrates an embodiment of a PROM protection logic 223 for protecting PROM 127 content during IC 100 test mode. PROMs are read in an asynchronous manner wherein the location Address 1211 and Control Signals 1209 (read enable and memory enable) are provided to the PROM 127. The PROM 127 responds by outputting the content of the location address on the Read Data signal line 1215. During the Test Control Logic 106-initiated reset as was previously described, the values of the input location Address 1211 and Control Signals 1209 are designed to read a specific location in the PROM 127 (for example, location address 0). The contents of that location specify the read-access rules for different areas of the PROM 127, if any. During reset, these read-access protection rules are stored in the PROM Protection Registers 1203. Once reset is removed, the contents of the PROM Protection Registers 1203 can not be changed. During Test Mode, all user-requested Read operations are evaluated by the PROM Access Logic 1201 prior to propagating the Read operation to the PROM 127. If the values stored in the PROM Protection Registers 1203 indicate that a user request for Read Access is targeting a protected location, the PROM access logic 1201 intercepts the request and prevents its propagation to the PROM 127.

Figure 13:
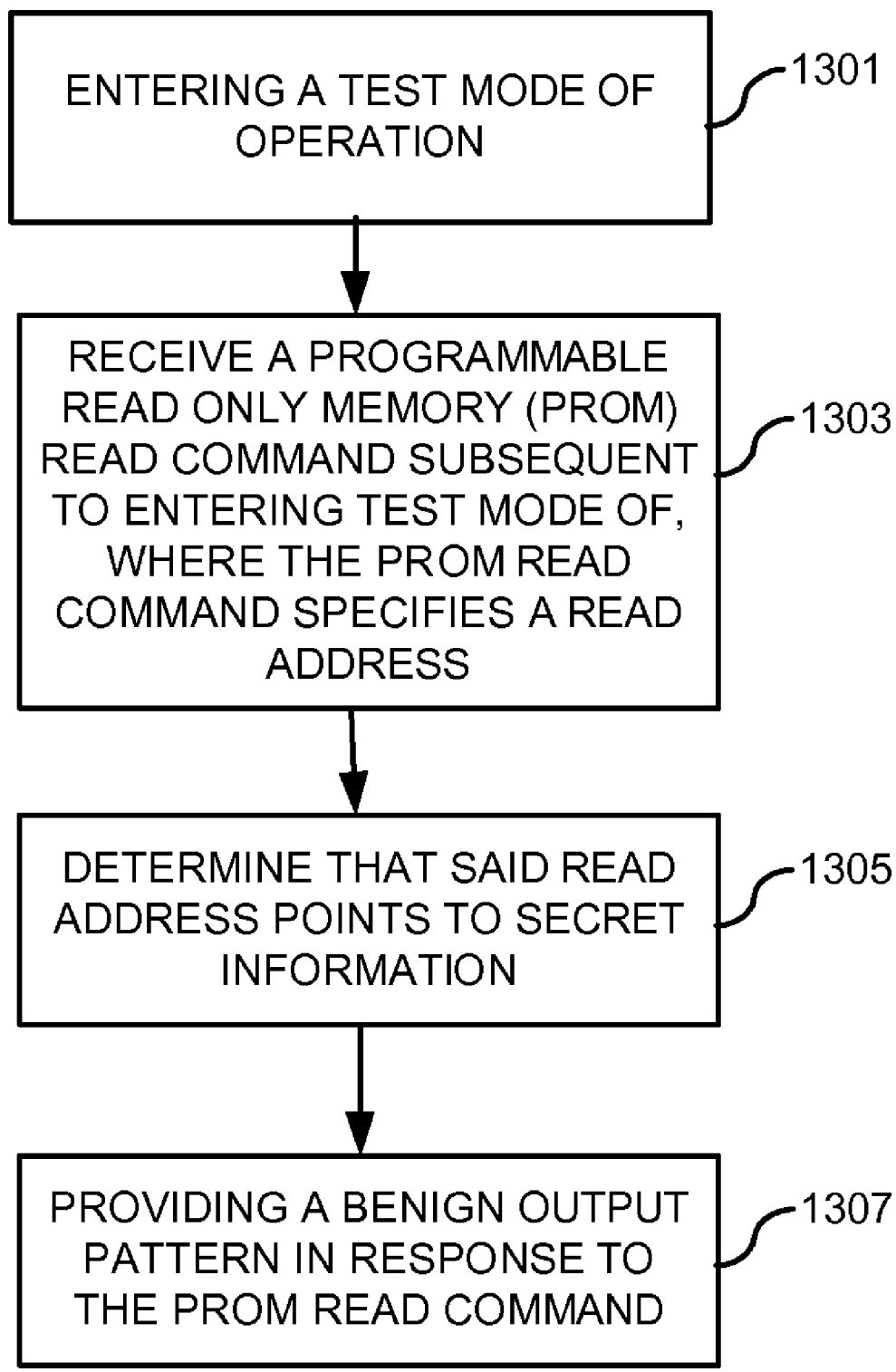
FIG. 13 is a flow chart illustrating a method of operation in accordance with the embodiment shown in FIG. 12.

FIG. 13 illustrates a method of operation where in 1301 the IC 100 enters a test mode. In 1303, a PROM read command is received after being in test mode, where the PROM read command specifies a PROM location address. In 1305 it is determined that the address location specified by the PROM read command points to secret information. A benign output (i.e. "garbage data") may then be provided in response to the PROM read command as shown in 1307.

Figure 6:
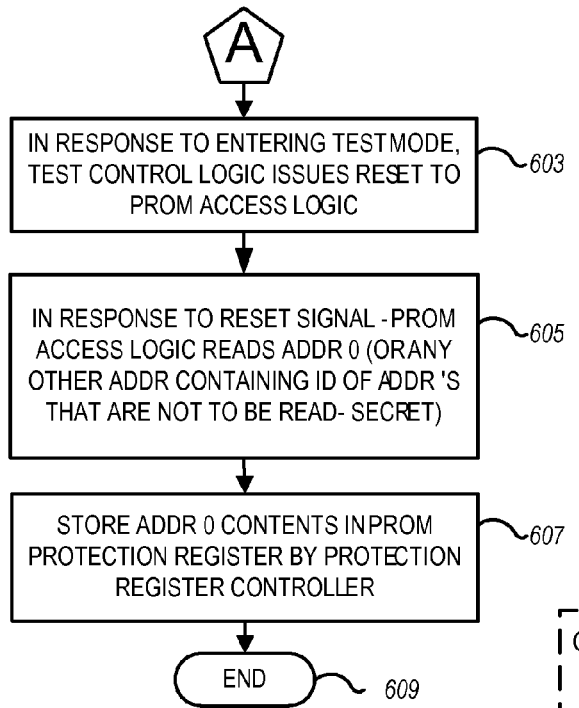
FIG. 6 is a flow chart showing details of operation of embodiments protecting data throughout various locations of an IC in continuation of FIG. 5, and for protecting PROM.

FIG. 6 also shows a method that may be operated in parallel with the method shown in FIG. 5. Thus after entering test mode in 501, the Test Control Logic 106 issues a reset command which resets the PROM access logic 1201 via reset 1207. The PROM access logic 1201 in response to the reset, reads an address of PROM 127, for example location address 0 or any other address containing identifiers of addresses that are not to be read and therefore secret, as shown in 605. In 607, the PROM access logic 1201 stores the location address (such as location address 0, etc.) contents in the PROM protection registers 1203. The method ends in 609.

Embodiments for the protection of ROM will now be described. The content of ROMs and also PROMs is fixed during the IC manufacturing processes. This content must be protected from malicious users while at the same time providing a mechanism to test the validity of the ROM content. Traditionally, ROMs are tested using a Memory Test Controller (MTC), such as MTC 110, which could allow an attacker to gain access to the contents of the PROM via the Test Control Logic 106 during test mode.

The present embodiment protects against MTC-based read attacks by disabling all Read operations to individual ROM rows. However, to ensure that the ROMs remain testable, the present embodiment includes a special Read function that is embedded into the ROM MTC 110. This function allows the MTC 110 to internally read a large number of rows and to compute an encrypted value or a signature for the contents of these rows using an encryption logic and in some embodiments, a multi-input shift register (MISR). The resulting encryption data or signature can be compared to an expected value of a non-faulty ROM to ensure that the ROM in test is free of fabrication faults without revealing the ROM content to an external user.

Figure 14:
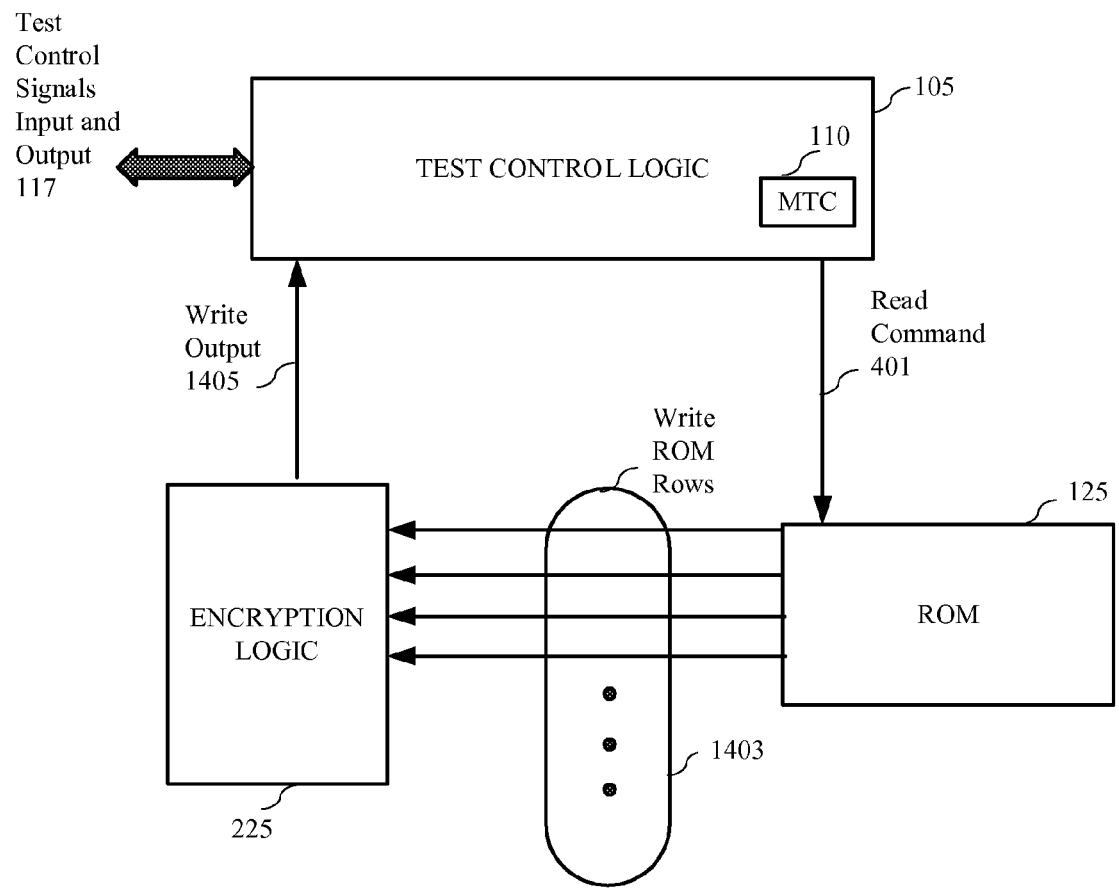
FIG. 14 is a block diagram on an integrated circuit ROM protection in accordance with an embodiment.
Figures 15, 16:
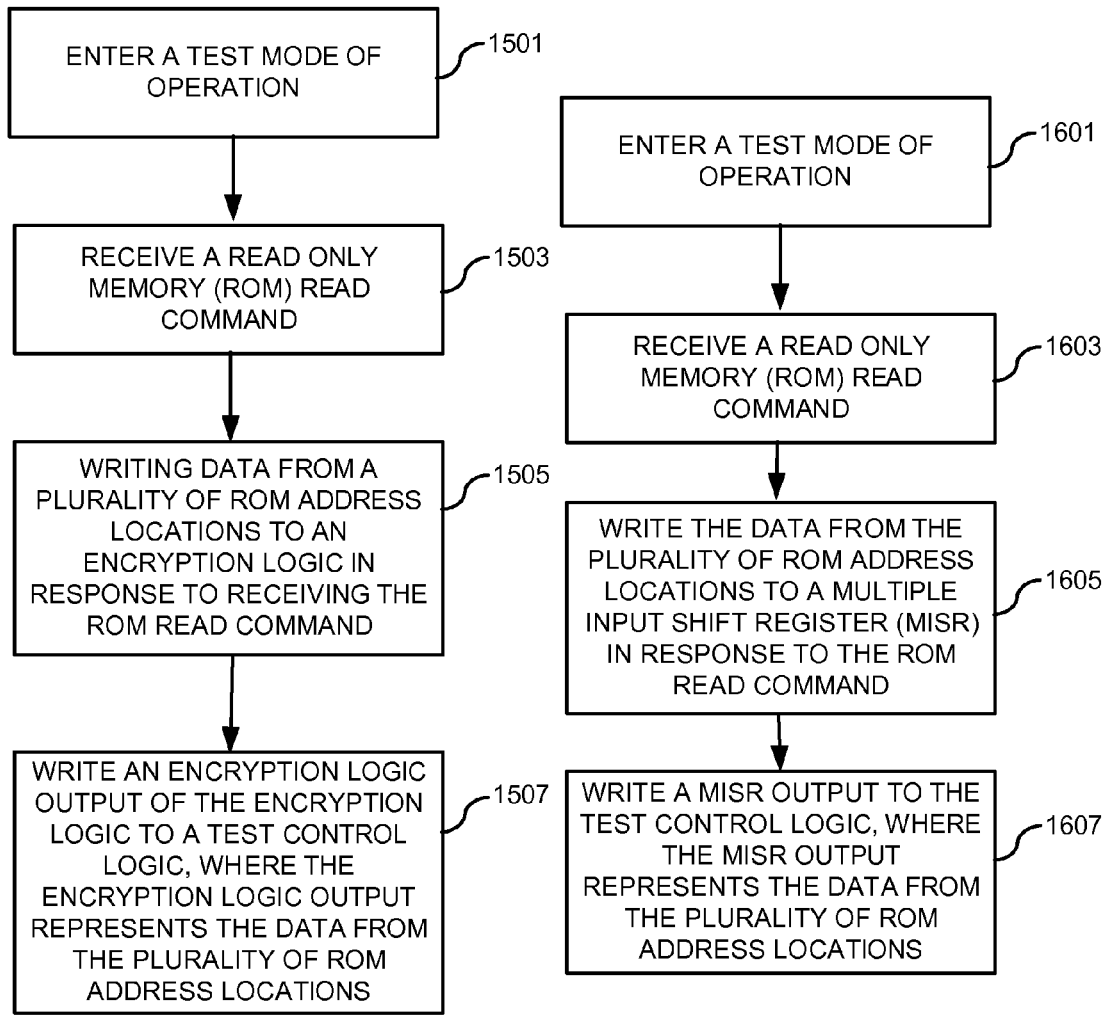
FIG. 15 is a flow chart illustrating a method of operation in accordance with the embodiment shown in FIG. 14.
FIG. 16 is a method illustrating an alternative embodiment for protection of ROM.

Turning to FIG. 14, the Test Control Logic 105 via MTC 110 may issue a read command 401 to ROM 125. In response, the ROM will write its rows of data 403 to an encryption logic 225. The encryption logic 225 will write an output 1405 to the Test Control Logic 106 or MTC 110 in response. FIG. 15 illustrates the method in accordance with the ROM protection embodiment shown in FIG. 14. In 1501 the IC 100 enters test mode. In 1503, a ROM read command 1401 is received which may be from the MTC 110. In 1505, the ROM 125 in response to the read command 1401 writes its rows of data 1403 to an encryption logic 225. The encryption logic writes the encryption output in 1507 to the Test Control Logic 106 or MTC 110 wherein the encryption output represents the ROM contents. The encryption output may be provided to the external world via test control input and output port 117.

Figure 8:
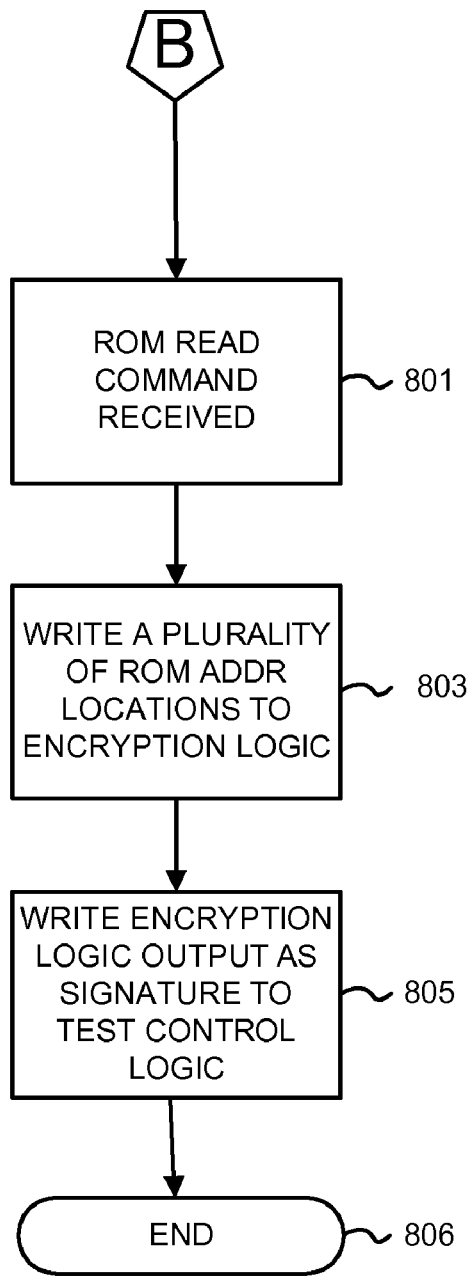
FIG. 8 is a flow chart showing details of operation of embodiments protecting data throughout various locations of an IC in continuation of FIG. 5, and for protecting ROM.

FIG. 16 illustrates an alternative embodiment where an MISR is used to provide an output representative of the ROM contents as shown in 1605 and 1607. FIG. 8 illustrates the method as used in parallel and in conjunction with the methods of FIG. 5, FIG. 6 and FIG. 7.

Figure 17:
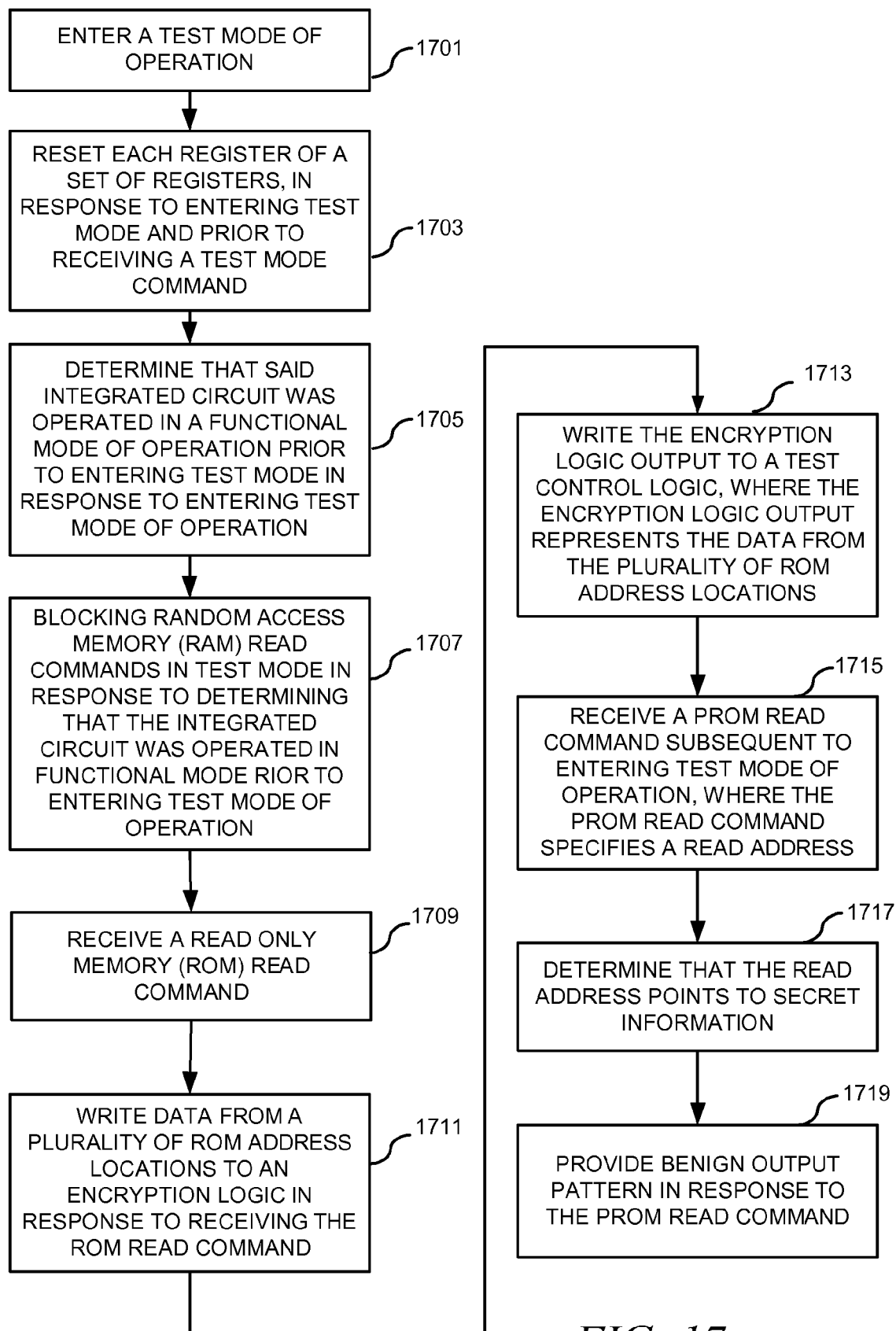
FIG. 17 is a flow chart showing a method of operation of an integrated circuit in accordance with an embodiment.

FIG. 17 illustrates an exemplary method for an embodiment that incorporates all of the various embodiments herein disclosed and so protects all registers, latches, ROM, RAM and PROM as has been disclosed herein.

What is claimed is:

1. A method of securing information on an integrated circuit, said method comprising:
    entering a test mode of operation;
    determining, in response to entering said test mode of operation, that said integrated circuit was operated in a functional mode of operation prior to entering said test mode of operation by determining that a set of registers contains known data in response to entering said test mode of operation, said set of registers being separate from a scan chain configuration; and
    blocking Random Access Memory (RAM) read commands when in said test mode of operation in response to determining that said integrated circuit was operated in said functional mode of operation prior to entering said test mode of operation.

2. The method of claim 1, wherein determining that said set of registers contains said known data further comprises:
    comparing contents of said set of registers, to a stored data;
    determining that said contents is a match with said stored data;
    determining, in response to said match, that said integrated circuit was operating in said functional mode of operation prior to entering said test mode of operation, and at least one RAM will contain secret information due to operating in said functional mode of operation; and
    blocking said RAM read commands from a test user interface of said integrated circuit.

3. The method of claim 2, wherein said encrypted data is obtained by a hashing operation performed on data contained by said at least one RAM while said integrated circuit is in said functional mode of operation, said encrypted data representing said data contained by said at least one RAM.

4. The method of claim 1, wherein determining that said set of registers contains said known data further comprises:
    comparing contents of said set of registers, to a stored data;
    determining that said contents is a match with said stored data;
    determining, in response to said match, that said integrated circuit was operating in said functional mode of operation prior to entering said test mode of operation, and said at least one RAM will contain secret information due to operating in said functional mode of operation;
    writing, subsequent to said blocking RAM read commands, a known bit pattern to all locations of said at least one RAM, in response to determining that said at least one RAM was operating in said functional mode; and
    allowing subsequent RAM read commands.

5. A method of securing information on an integrated circuit, said method comprising:
    entering a test mode of operation;
    resetting each register of a set of registers, in response to entering said test mode of operation and prior to receiving a test mode command;
    determining, in response to entering said test mode of operation, that said integrated circuit was operated in a functional mode of operation prior to entering said test mode of operation;
    blocking Random Access Memory (RAM) read commands when in said test mode of operation in response to determining that said integrated circuit was operated in said functional mode of operation prior to entering said test mode of operation;
    writing, a known bit pattern to all locations of at least one RAM, in response to determining that said at least one RAM was operating in said functional mode;
    allowing subsequent RAM read commands;
    receiving a Read Only Memory (ROM) read command;
    writing data from a plurality of ROM address locations to an encryption logic in response to receiving said ROM read command;
    writing an encryption logic output of said encryption logic to a test control logic, said encryption logic output representing said data from said plurality of ROM address locations;

receiving a Programmable Read Only Memory (PROM) read command subsequent to entering said test mode of operation, said PROM read command specifying a read address;

determining that said read address points to secret information; and providing an output pattern in response to said PROM read command.

6. The method of claim 5, further comprising:

exiting a scan mode of operation; and resetting each register of a set of registers, in response to exiting said scan mode of operation.

7. An integrated circuit, comprising:

at least one Random Access Memory (RAM);

a set of registers, said set of registers being separate from a scan chain configuration of a test mode;

a test control logic coupled to said at least one RAM and said set of registers, said test control logic being operative to:

configure said integrated circuit into said test mode and to control said integrated circuit while in said test mode;

determine, in response to entering said test mode of operation, that said integrated circuit was operated in a functional mode prior to entering said test mode by determining that said set of registers contains known data in response to entering said test mode; and block RAM read commands when in said test mode in response to determining that said integrated circuit was operated in said functional mode prior to entering said test mode.

8. The integrated circuit of claim 7, wherein said test controller is further operative to:

determine that said set of registers contains said known data by:

comparing contents of said set of registers, to stored data;

determining that said contents is a match with said stored data;

determining, in response to said match, that said integrated circuit was operating in said functional mode prior to entering said test mode, and said at least one RAM will contain secret information due to operating in said functional mode; and blocking said RAM read commands from a test user interface of said integrated circuit.

9. The integrated circuit of claim 7, further comprising:

a test input port coupled to said test control logic, to receive said RAM read commands;

a test output port coupled to said test control logic, for receiving output data from said at least one RAM; and wherein said test control logic further comprises at least one memory test control logic coupled to said at least one RAM, said memory test control logic being operative to block said RAM read commands when in said test mode in response to determining that said integrated circuit was operated in said functional mode prior to entering said test mode.

10. The integrated circuit of claim 9, wherein said integrated circuit is a RAM integrated circuit.

11. An integrated circuit comprising:

a test control logic operative to configure said integrated circuit into a test mode and to control said integrated circuit while in said test mode;

a set of registers;

a functional reset controller coupled to said test control logic and to said set of registers, operative to receive a reset command from said test control logic and provide said reset command to said set of registers in response to a command to enter said test mode;

at least one Random Access Memory (RAM) coupled to said test control logic;

at least one Read Only Memory (ROM) coupled to said test control logic;

an encryption logic coupled to said test control logic; and at least one Programmable Read Only Memory (PROM) coupled to said test control logic;

wherein said test control logic is further operative to:

determine that said integrated circuit was operated in a functional mode prior to entering said test mode in response to entering said test mode;

block RAM read commands when in said test mode in response to determining that said integrated circuit was operated in said functional mode prior to entering said test mode;

receive a ROM read command;

write data from a plurality of ROM address locations to said encryption logic in response to receiving said ROM read command;

receive an encryption logic output of said encryption logic, said encryption logic output representing said data from said plurality of ROM address locations;

receive a PROM read command subsequent to entering said test mode, said PROM read command specifying a read address;

determine that said read address points to secret information; and provide an output pattern in response to said PROM read command.

* * * * *